United States Patent
Rokuhara et al.

(10) Patent No.: US 9,437,821 B2
(45) Date of Patent: Sep. 6, 2016

(54) METHOD FOR MANUFACTURING ELECTRONIC DEVICE

(71) Applicant: SUMITOMO CHEMICAL COMPANY, LIMITED, Tokyo (JP)

(72) Inventors: Kouichi Rokuhara, Ibaraki (JP); Shuichi Sassa, Ehime (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 14/434,518

(22) PCT Filed: Oct. 7, 2013

(86) PCT No.: PCT/JP2013/077246
§ 371 (c)(1),
(2) Date: Apr. 9, 2015

(87) PCT Pub. No.: WO2014/061493
PCT Pub. Date: Apr. 24, 2014

(65) Prior Publication Data
US 2015/0280126 A1  Oct. 1, 2015

(30) Foreign Application Priority Data

Oct. 15, 2012 (JP) .................................. 2012-228373
May 31, 2013 (JP) .................................. 2013-115339

(51) Int. Cl.
*H01L 51/00* (2006.01)
*H01L 51/56* (2006.01)
(Continued)

(52) U.S. Cl.
CPC ........... *H01L 51/003* (2013.01); *H01L 29/786* (2013.01); *H01L 51/0043* (2013.01);
(Continued)

(58) Field of Classification Search
CPC ............... H01L 51/003; H01L 29/786; H01L 2251/308; H01L 51/006; H05B 33/10
USPC ........................................................... 438/46
See application file for complete search history.

(56) References Cited

U.S. PATENT DOCUMENTS 8,067,296 B2    11/2011  Kawana et al.
2002/0039160 A1*  4/2002  Nam ................. G02F 1/133788
                                                        349/123
(Continued)

FOREIGN PATENT DOCUMENTS

EP    1179863 A2   2/2002
EP    1863093 A2   12/2007
(Continued)

OTHER PUBLICATIONS

International Search Report for PCT/JP2013/077246 dated Jan. 14, 2014.
(Continued)

*Primary Examiner* — Amar Movva
*Assistant Examiner* — Omar Mojaddedi
(74) *Attorney, Agent, or Firm* — Sughrue Mion, PLLC

(57) ABSTRACT

When a thin film is formed by an application method, damage to a substrate or existing electrodes and functional layers can be reduce. A method for manufacturing an electronic device comprising two or more electrodes, and an organic thin film provided between the two or more electrodes, the method comprising the steps of: forming a coating film by applying a coating liquid that comprises a material having a crosslinking group, and forming the organic thin film by repeating an irradiation of electromagnetic waves to the coating film to cross-link with the crosslinking group.

6 Claims, 1 Drawing Sheet

(51) Int. Cl.
  *H01L 29/786* (2006.01)
  *H01L 51/05* (2006.01)
  *H01L 51/42* (2006.01)
  *H01L 51/50* (2006.01)
  *H01L 51/10* (2006.01)
  *H01L 51/44* (2006.01)
  *C08G 61/12* (2006.01)

(52) U.S. Cl.
  CPC ............ *H01L51/05* (2013.01); *H01L 51/10* (2013.01); *H01L 51/42* (2013.01); *H01L 51/44* (2013.01); *H01L 51/50* (2013.01); *H01L 51/56* (2013.01); *C08G 61/12* (2013.01); *C08G 2261/124* (2013.01); *C08G 2261/135* (2013.01); *C08G 2261/141* (2013.01); *C08G 2261/3142* (2013.01); *C08G 2261/3162* (2013.01); *C08G 2261/5222* (2013.01); *C08G 2261/76* (2013.01); *C08G 2261/95* (2013.01); *H01L 51/0029* (2013.01); *H01L 51/0037* (2013.01); *H01L 51/0039* (2013.01); *H01L 51/5056* (2013.01); *H01L 2251/308* (2013.01); *Y02E 10/549* (2013.01); *Y02P 70/521* (2015.11)

(56) References Cited

U.S. PATENT DOCUMENTS

| | | | |
|---|---|---|---|
| 2003/0072890 A1* | 4/2003 | Miyazawa | C23C 14/042 427/554 |
| 2004/0062950 A1* | 4/2004 | Iwanaga | H01L 51/006 428/690 |
| 2005/0072021 A1 | 4/2005 | Steiger et al. | |
| 2006/0021975 A1 | 2/2006 | Ott et al. | |
| 2007/0290194 A1 | 12/2007 | Becker et al. | |
| 2008/0042558 A1* | 2/2008 | Buchhauser | H01L 27/3225 313/504 |
| 2010/0021737 A1 | 1/2010 | Beck et al. | |
| 2010/0022092 A1* | 1/2010 | Horiguchi | G03F 7/09 438/706 |
| 2010/0190296 A1 | 7/2010 | Kawana et al. | |
| 2011/0171365 A1* | 7/2011 | Kuroda | C23C 14/086 427/78 |
| 2013/0126860 A1* | 5/2013 | Fukuda | C08L 79/08 257/43 |
| 2014/0091419 A1* | 4/2014 | Hasegawa | H01L 27/14621 257/432 |

FOREIGN PATENT DOCUMENTS

| | | | | |
|---|---|---|---|---|
| EP | 2357684 A1 | 8/2011 | | |
| JP | 2004-102114 A | 4/2004 | | |
| JP | 2009-129603 A | 6/2009 | | |
| JP | 2009-252944 A | 10/2009 | | |
| JP | 2010-505619 A | 2/2010 | | |
| JP | 2012-129229 A | 7/2012 | | |
| WO | 2005093870 A1 | 10/2005 | | |
| WO | WO 2006015328 A2 * | 2/2006 | ............ | B05D 3/148 |
| WO | 2006/064792 A1 | 6/2006 | | |
| WO | 2007/060837 A1 | 5/2007 | | |
| WO | 2009/107497 A1 | 9/2009 | | |
| WO | 2011068232 A1 | 6/2011 | | |
| WO | 2011126076 A1 | 10/2011 | | |
| WO | 2012108326 A1 | 8/2012 | | |

OTHER PUBLICATIONS

Communication dated Apr. 20, 2016, from the State Intellectual Property Office of People's Republic of China in counterpart Application No. 201380052889.1.

Adam E. A. Contoret et al., "Polarized Electroluminescence from an Anisotropic Nematic Network on a Non-contact Photoalignment Layer", Advanced Materials, Jul. 5, 2000, vol. 12, No. 13, pp. 971-974.

Communication dated May 30, 2016, issued by the European Patent Office in corresponding European Application No. 13847203.0.

* cited by examiner

METHOD FOR MANUFACTURING ELECTRONIC DEVICE

CROSS REFERENCE TO RELATED APPLICATIONS

This application is a National Stage of International Application No. PCT/JP2013/077246 filed Oct. 7, 2013, claiming priority based on Japanese Patent Application Nos. 2012-228373 filed Oct. 15, 2012 and 2013-115339 filed May 31, 2013, the contents of all of which are incorporated herein by reference in their entirety.

TECHNICAL FIELD

The present invention relates to a method for manufacturing an electronic device and a method for manufacturing a thin film.

BACKGROUND ART

An electronic device such as an organic electroluminescent element (may also be referred to as an organic EL element), an organic photovoltaic device, or an organic thin film transistor comprises two or more electrodes and an organic thin film provided between the two or more electrodes. Such an electronic device may comprise a structure in which a plurality of layers comprising the organic thin film are stacked (hereinafter, may be referred to as a stacked structure).

For example, in a method for manufacturing an organic EL element, a step of forming an organic thin film has been known comprising the steps of applying a coating liquid to a prescribed area by an application method such as an ink jet method to form a coating film and irradiating the coating film with laser light to dry the coating film (refer to Patent Document 1).

RELATED ART DOCUMENTS

Patent Document

Patent Document 1: WO 2006/064792

DISCLOSURE OF INVENTION

Problem to be Solved by the Invention

In a method for manufacturing an electronic device, when more than two layers (thin films) in a stacked structure provided between the two or more electrodes are continuously formed by an application method (a layer formed earlier may be referred to as a lower layer and other layers formed later so as to be bonded to the lower layer are referred to as upper layers), a coating liquid for forming the upper layers is applied to the surface of the lower layer to form the upper layers. In this step, a part of or the whole of the lower layer may be dissolved into the coating liquid applied onto the lower layer. In order to prevent the lower layer from dissolving, the components of the lower layer are crosslinked and thus the lower layer can be solidified, for example, by using a material containing a crosslinking group or adding a crosslinking agent to a material when the lower layer is formed. However, when a crosslinking reaction is carried out by heat treatment using the material containing the crosslinking group or using the crosslinking agent, a long period of time is needed for the heat treatment. Consequently, carrying out the crosslinking reaction in a short period of time through irradiation of intense light such as laser light can be considered. However, the temperatures of a substrate or existing electrodes and functional layers become excessively high in this case. This may cause deformation of the substrate or damage to the electrodes and the functional layers.

The present invention is made in view of the above problem and an object of the present invention is to provide a method for manufacturing an electronic device that can reduce damage such as deformation of a substrate and damage to electrodes and functional layers and also provide a method for manufacturing a thin film used for the electronic device.

Means for Solving Problem

The present invention provides [1] to [8] below.
[1] A method for manufacturing an electronic device comprising two or more electrodes and an organic thin film provided between the two or more electrodes, the method comprising the steps of:
  forming a coating film by applying a coating liquid that comprises a material having a crosslinking group, and
  forming the organic thin film by repeating an irradiation of electromagnetic waves to the coating film to cross-link with the crosslinking group.
[2] The method for manufacturing the electronic device according to above [1], wherein
  the source of the electromagnetic waves is a xenon flash lamp.
[3] The method for manufacturing the electronic device according to above [1] or [2], wherein
  at the step of forming the organic thin film, the organic thin film is formed by repeating the irradiation of the electromagnetic waves through a filter such that a transmittance of electromagnetic waves wavelength of which is equal to 400 nm or less is equal to 10% or less.
[4] The method for manufacturing the electronic device according to any one of above [1] to [3], wherein
  the electronic device is an organic electroluminescent element, an organic photovoltaic device, or an organic thin film transistor.
[5] The method for manufacturing the electronic device according to any one of above [1] to [4], wherein
  the step of forming the organic thin film is carried out by preparing a flexible substrate that is wound on an unwind roll, and unwinding the flexible substrate from the unwind roll and winding the flexible substrate up a wind-up roll.
[6] The method for manufacturing the electronic device according to any one of above [1] to [5], wherein
  the step of forming the organic thin film is carried out such that the peak energy of a pulse of the electromagnetic waves is equal to 15.0 kW/cm$^2$ or less.
[7] The method for manufacturing the electronic device according to any one of above [1] to [6], wherein
  the step of forming the organic thin film is carried out such that the pulse width per pulse of the electromagnetic waves is equal to 160 μs or less.
[8] A method for manufacturing a thin film, the method comprising the steps of:
  forming a coating film by applying a coating liquid that comprises a material having a crosslinking group, and
  forming the thin film by repeating an irradiation of electromagnetic waves to the coating film to cross-link with the crosslinking group.

Effect of the Invention

By a method for manufacturing an electronic device and a method for manufacturing a thin film of the present invention, the thin film can be solidified in a short period of time and damage to the substrate or the existing electrodes and functional layers can be reduced when the thin film is formed by an application method and, as a result, the functions of the manufactured electronic device can be improved.

DESCRIPTION OF EMBODIMENTS

Figure 1:
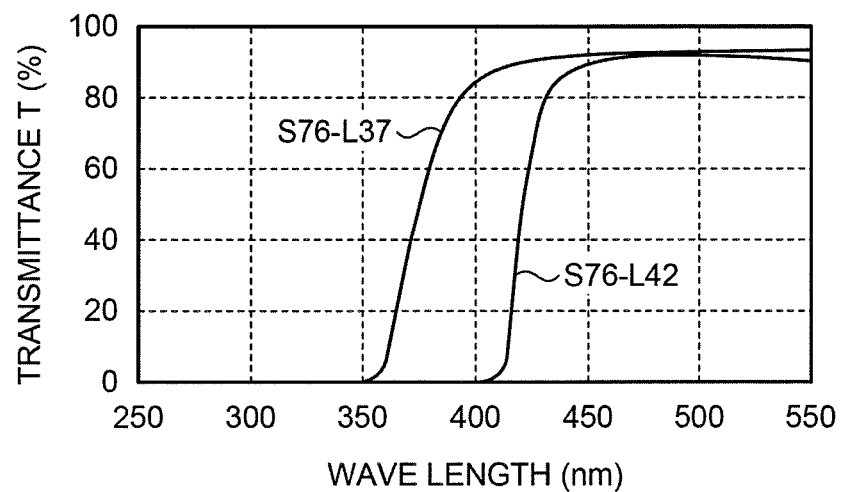
FIG. 1 is a graph (1) illustrating characteristics of a filter used.

Hereinafter, a method for manufacturing an electronic device of the present invention will be described.

The method for manufacturing an electronic device of the present invention is a method for manufacturing an electronic device comprising two or more electrodes, and an organic thin film provided between the two or more electrodes. The method comprises the steps of: forming a coating film by applying a coating liquid that contains a material having a crosslinking group, and forming the organic thin film by repeating irradiation of electromagnetic waves to the coating film to cross-link with the crosslinking group.

Examples of the electronic device of the present invention include an organic EL element, an organic photovoltaic device, and an organic thin film transistor.

The organic thin film used for the electronic device of the present invention is suitably used when a thin film is formed on the organic thin film by an application method.

The organic thin film used for the electronic device of the present invention is suitably used for, for example, a hole transport layer, a light-emitting layer, and an electron transport layer formed by the application method in the case of an organic EL element. The organic thin film is also suitably used for, for example, a hole transport layer, an active layer, and an electron transport layer formed by the application method in the case of an organic photovoltaic device and suitably used for, for example, a hole injection layer, an active layer, and an electron injection layer formed by the application method in the case of an organic thin film transistor.

The phrase "the organic thin film provided between the electrodes" means an organic thin film that is located so that the organic thin film can act as at least a part of a path for electrons or holes moving between the electrodes.

(Step of Forming a Coating Film by Applying a Coating Liquid that Contains a Material Having a Crosslinking Group)

First, the coating liquid is prepared. The coating liquid contains at least a material as a main component and a solvent. Examples of the material as the main component include a material that exerts a prescribed function of the organic thin film such as a light emitting material and a hole transport material when the electronic device is an organic EL element and a photovoltaic material when the electronic device is an organic photovoltaic device. The material as the main component comprises (1) the case in which the material itself that exerts the prescribed function of the organic thin film does not have a crosslinking group but a crosslinking agent is further contained as a material having crosslinking groups and (2) the case in which the material itself that exerts the prescribed function of the organic thin film has a crosslinking group.

Examples of the application method for forming the coating film by applying the prepared coating liquid include a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method. The application method can be carried out as a step of applying the coating liquid under the atmosphere of approximately normal pressure and under the air atmosphere.

(Step of Forming the Organic Thin Film by Repeating Irradiation of Electromagnetic Waves to the Coating Film to Cross-Link with the Crosslinking Group)

Subsequently, irradiation of electromagnetic waves to the formed coating film is repeated. The phrase "irradiation of electromagnetic waves to the coating film is repeated" means that irradiation of electromagnetic waves to a certain part of the coating film is repeated. Examples of the source of emitting electromagnetic waves may include a source that continuously emits electromagnetic waves at steady intensity and a source that emits electromagnetic waves in pulses. When the source that continuously emits electromagnetic waves is used, the electromagnetic waves emitted from the source are intermittently shielded using, for example, a chopper and the coating film is intermittently irradiated with the electromagnetic waves.

By repeating irradiation of electromagnetic waves, a state in which the coating film is irradiated with electromagnetic waves and a state in which the coating film is not irradiated with electromagnetic waves are alternately repeated. Hereinafter, in one set of the state of irradiation of electromagnetic waves and the state of no irradiation of electromagnetic waves, a sequence of electromagnetic waves in the state of irradiation of electromagnetic waves is defined as one pulse.

When a time width of one pulse (referred to as a pulse width) takes a long period of time, the substrate and the like are excessively heated. When the pulse width is excessively short, the pulse width is insufficient for the crosslinking reaction and thus a time required for the solidification step takes a long period of time. The pulse width is appropriately 1 μs to 1000 μs, preferably 50 μs to 500 μs, more preferably 50 μs to 160 μs, and further preferably 50 μs to 100 μs.

When the cycle of the repeating takes a long period of time, the state of no irradiation of electromagnetic waves becomes short and thus the substrate and the like are excessively heated. When the cycle is excessively short, the solidification step takes a long period of time. The state of irradiation of electromagnetic waves is appropriately repeated in a cycle of 0.1 Hz to 500 Hz and preferably repeated in a cycle of 1 Hz to 50 Hz. Here, the phrase "the state of irradiation of electromagnetic waves is repeated in X Hz" means that one-pulse electromagnetic waves are output X times in one second.

When energy in one pulse is excessively high, the substrate and the like are excessively heated. When the energy is excessively low, the energy is insufficient for the crosslinking reaction and thus the solidification step takes a long period of time. The energy is appropriately 0.1 J/cm$^2$ to 100 J/cm$^2$ and preferably 0.5 J/cm$^2$ to 50 J/cm$^2$.

When peak energy in one pulse (referred to as pulse peak energy) is excessively high, the substrate and the like are excessively heated. When the pulse peak energy is excessively low, the pulse peak energy is insufficient for the crosslinking reaction and thus the solidification step takes a long period of time. The pulse peak energy is appropriately 0.05 kW/cm$^2$ to 500 kW/cm$^2$, preferably 5.0 kW/cm$^2$ to 15.0 kW/cm$^2$, and preferably 5.0 kW/cm$^2$ to 8.0 kW/cm$^2$.

The total energy of electromagnetic waves with which a certain part is irradiated by repeating irradiation of electromagnetic waves is appropriately 100 J/cm$^2$ to 10000 J/cm$^2$ and preferably 500 J/cm$^2$ to 5000 J/cm$^2$.

The wavelength of the electromagnetic waves for irradiation is not limited. The wavelength is preferably in the range of visible light to near infrared light (a wavelength of in a range of about 400 nm to 1100 nm) because the functions and properties of a thin film to be formed and other components are not impaired when the wavelength is in this range.

Examples of the source of electromagnetic waves may include laser light, a xenon flash lamp, a high pressure mercury lamp, and a halogen lamp. The xenon flash lamp is preferably used as the source of electromagnetic waves. For example, a xenon flash lamp having a configuration disclosed in Japanese Patent Application Laid-open No. 2003-338265 can be used as the source of electromagnetic waves.

The step of forming the organic thin film is preferably a step of repeating the irradiation of electromagnetic waves through a filter such that a transmittance of electromagnetic waves the wavelength of which is equal to 400 nm or less is equal to 10% or less.

Use of such a filter can reduce damage caused by irradiating existing components with electromagnetic waves.

The method for manufacturing the electronic device comprising the steps of forming the organic thin film comprises the steps of forming two or more electrodes and forming the organic thin film provided between the two or more electrodes. Here, the method for manufacturing the electronic device may include the step of forming a thin film in addition to the organic thin film formed as described above between the two or more electrodes.

The step of forming the organic thin film provided between the two or more electrodes may be carried out by what is called a roll-to-roll method or a single substrate method.

For example, the step of forming the organic thin film is carried out in a step from unwinding the flexible substrate that is wound on an unwind roll from the unwind roll to winding the flexible substrate up a wind-up roll. In other words, the step of forming the organic thin film provided between the two or more electrodes can be carried out by the roll-to-roll method using a long flexible substrate.

The step of forming the organic thin film may also be carried out by preparing a flexible substrate that is wound on an unwind roll or a long structure body formed by forming flexible electrodes and the like on a flexible substrate, and unwinding the flexible substrate or the long structure body from the unwind roll and winding the flexible substrate or the long structure body up a wind-up roll.

Here, the outline of the roll-to-roll method will be described.

In the step of forming the organic thin film by the roll-to-roll method, first, the coating film is formed by continuously applying a coating liquid containing a material having the crosslinking group to the main surface of the flexible substrate exposed between the unwind roll and the wind-up roll while the long flexible substrate that is stretched across the unwind roll and the wind-up roll is continuously conveyed. Subsequently, the organic thin film is formed by repeating the irradiation of electromagnetic waves to crosslink the crosslinking group to solidify the coating film while the flexible substrate on which the coating film is formed is further continuously conveyed. By this step, the organic thin film becomes insoluble to the coating liquid applied onto the surface of the film in the subsequent steps.

Subsequently, another thin film can be sequentially further formed on the organic thin film in which the crosslinking group is crosslinked. In this case, damage to the underlayer organic thin film caused by the coating liquid for forming the thin film can be reduced because the underlayer organic thin film is not dissolved even when the thin film is formed by the application method.

Although all the components of the electronic device can be formed by the roll-to-roll method, only the organic thin film, for example, may be formed by the roll-to-roll method. For example, the electronic device may be prepared by preparing a flexible substrate on which electrodes are previously formed, forming one or a plurality of organic thin films by the roll-to-roll method using the flexible substrate, cutting the flexible substrate at a prescribed portion, and further forming electrodes by a single substrate method.

When the electronic device such as an organic EL element, an organic photovoltaic device, or an organic thin film transistor is manufactured, the long flexible substrate suitably used in the roll-to-roll method is not particularly limited as long as the long flexible substrate is a substrate that can be wound up in a roll shape such as a film or a sheet made from a colorless and transparent resin. Here, the substrate is preferably an insulating substrate. Examples of the resin used for such a substrate may include polyethersulfone (PES); polyester resins such as polyethylene terephthalate (PET) and polyethylene naphthalate (PEN); polyolefin resins such as polyethylene (PE), polypropylene (PP), and cyclic polyolefins; a polyamide resin; a polycarbonate resin; a polystyrene resin; a polyvinyl alcohol resin; a saponified ethylene-vinyl acetate copolymer; a polyacrylonitrile resin; an acetal resin; a polyimide resin; and an epoxy resin.

Among these resins, the polyester resins and the polyolefin resins are preferable and polyethylene terephthalate and polyethylene naphthalate are particularly preferable because these resins have high heat resistance and low linear expansion coefficients, and can be manufactured at low cost. These resins may be used singly or in combination of two or more of them.

As the substrate, metal substrates such as an aluminum substrate and a glass substrate can also be used. When the metal substrate and the glass substrate are applied to the roll-to-roll method, the substrate having a small thickness that exerts flexibility can be used.

The thickness of the flexible substrate is not particularly limited. The thickness of the flexible substrate is appropriately determined in consideration of stability at the time of film formation. The thickness of the flexible substrate is preferably in a range of 5 μm to 500 μm, more preferably in a range of 50 μm to 200 μm, and particularly preferably in a range of 50 μm to 100 μm.

When the electronic device is manufactured while the long flexible substrate or the long structure body is used and conveyed by the roll-to-roll method, steady irradiation of electromagnetic waves may cause the substrate to be excessively heated or to sag, or the functional layers constituting the structure body to be deteriorated. In the manufacturing method of present invention, however, the irradiation of electromagnetic waves is repeated and thus defects such as the sag of the substrate and the deterioration in the functional layers due to the irradiation of electromagnetic waves can be reduced.

When the electronic device is manufactured while the flexible substrate is conveyed in the roll-to-roll method, an extremely long conveying distance is needed for securing the time required for completing the crosslinking reaction by the conventional heat treatment. However, when the irradiation of the prescribed electromagnetic waves is repeated under the prescribed conditions as in the manufacturing method of the present invention, the crosslinking reaction can be completed in an extremely short period of time without excessive temperature rise of the existing components. Therefore, in the method for manufacturing the electronic device and the method for manufacturing the thin film used for the electronic device of the present invention, the manufacturing method by the roll-to-roll method can be suitably applied.

Hereinafter, configuration examples that the electronic device (an organic EL element, an organic photovoltaic device, or an organic thin film transistor) of the present embodiment can form and configurations of each layer and a method for forming each of the layers will be described.

<Organic EL Element>

The organic EL element of the present embodiment comprises a stacked structure comprising an anode, a cathode, and between these electrodes, a hole injection layer, a hole transport layer, and a light-emitting layer. The present embodiment describes an example in which, when the light-emitting layer is formed by the application method, the forming step of the hole transport layer comprises the steps of forming a coating film by applying a coating liquid that contains a material having a crosslinking group, and forming the organic thin film by repeating irradiation of electromagnetic waves to the coating film to cross-link with the crosslinking group as described above.

Examples of the layer provided between the cathode and the light-emitting layer may include an electron injection layer, an electron transport layer, and a hole block layer. When both of the electron injection layer and the electron transport layer are provided between the cathode and the light-emitting layer, the layer contacting the cathode is referred to as the electron injection layer and the layer except the electron injection layer is referred to as the electron transport layer.

The electron injection layer has a function that improves electron injection efficiency from the cathode. The electron transport layer has a function that improves electron injection from the cathode, the electron injection layer, or the electron transport layer that is closer to the cathode.

The hole block layer is a layer having a function that blocks the transport of holes. When the electron injection layer and/or the electron transport layer have the function that blocks the transport of holes, these layers also serve as the hole block layer.

Whether the hole block layer has the function that blocks the transport of holes can be ascertained by, for example, preparing an organic EL element that flows hole current alone and determining an effect of blocking the transport of holes by a decrease in the current value.

Examples of the layers provided between the anode and the light-emitting layer may include a hole injection layer, a hole transport layer, and an electron block layer. The layer contacting the anode is referred to as the hole injection layer.

The hole injection layer has a function that improves hole injection efficiency from the anode. The hole transport layer has a function that improves hole injection from the anode, the hole injection layer, or the hole transport layer that is closer to the anode.

The electron block layer has a function that blocks the transport of electrons. When the hole injection layer and/or the hole transport layer have the function that blocks the transport of electrons, these layers also serve as the electron block layer.

Whether the electron block layer has the function that blocks the transport of electrons can be ascertained by, for example, preparing an organic EL element that flows electron current alone and determining an effect of blocking the transport of electrons by a decrease in the measured current value.

Examples of the layer configurations of the organic EL element are as follows:

a) Anode/Light-emitting layer/Cathode
b) Anode/Hole injection layer/Light-emitting layer/Cathode
c) Anode/Hole injection layer/Light-emitting layer/Electron injection layer/Cathode
d) Anode/Hole injection layer/Light-emitting layer/Electron transport layer/Electron injection layer/Cathode
e) Anode/Hole injection layer/Hole transport layer/Light-emitting layer/Cathode
f) Anode/Hole injection layer/Hole transport layer/Light-emitting layer/Electron injection layer/Cathode
g) Anode/Hole injection layer/Hole transport layer/Light-emitting layer/Electron transport layer/Electron injection layer/Cathode
h) Anode/Light-emitting layer/Electron injection layer/Cathode
i) Anode/Light-emitting layer/Electron transport layer/Electron injection layer/Cathode The symbol "/" means that layers located both sides of the symbol "/" are in contact with each other.

The organic EL element of the present embodiment may have a single layer light-emitting layer or a light-emitting layer made of two or more layers. In any one of the layer configurations a) to i), when the stacked body located between the anode and the cathode is defined as a "structural unit A", examples of the configuration of the organic EL element having two light-emitting layers may include the layer configuration j) below. The layer configuration having two structural units A may be the same as or different from each other.

j) Anode/(Structural unit A)/Charge generation layer/(Structural unit A)/Cathode Here, the charge generation layer is a layer that generates holes and electrons by applying an electric field. Examples of the charge generation layer may include thin film made from vanadium oxide, indium tin oxide (ITO), and molybdenum oxide.

When "(Structural unit A)/Charge generation layer" is defined as "Structural unit B", examples of the configuration of the organic EL element having three or more light-emitting layers may include the layer configuration k) below.

k) Anode/(Structural unit B)x/(Structural unit A)/Cathode

Here, the symbol "x" represents an integer equal to 2 or more. The phrase "(Structural unit B)x" represents a stacked body in which x stacks of (Structural unit B) are stacked. The layer configuration having a plurality of stacks of (structural unit B) may be the same as or different from each other.

The organic EL element can be constituted by directly stacking a plurality of light-emitting layers without providing any charge generation layer.

The organic EL element providing the above-described configuration is generally provided on a substrate. The order of layers to be formed, the number of layers, and the thicknesses of each layer can be appropriately determined in consideration of light-emitting efficiency and lifetime. The organic EL element is generally provided on a substrate by locating the anode on the substrate side. However, the organic EL element may be provided on a substrate by locating the cathode on the substrate side. For example, when each of the organic EL elements a) to k) is manufactured on the substrate, each of the layers is sequentially stacked on the substrate from the anode side (the left side of each of the components a to k) when the anode is located on the substrate side, while each of the layers is sequentially stacked on the substrate from the cathode side (the right side of each of the components a to k) when the cathode is located on the substrate side. The organic EL element may be a bottom emission type organic EL element that emits light from the substrate side or may be a top emission type organic EL element that emits light from the side opposite to the substrate.

The following describes materials for constituting the organic EL element and a method for manufacturing the organic EL element in greater detail.

<Substrate>

As the substrate, a substrate that does not chemically change in the step of manufacturing the organic EL element is suitably used. For example, the substrate may be rigid substrates such as a glass substrate and a silicon substrate or flexible substrates such as a plastic substrate and a macromolecular film. When the flexible substrate is used, a flexible organic EL element can be formed as a whole and the organic EL element can be formed by the roll-to-roll method. In the substrate, electrodes and a driver circuit for driving the organic EL element may be previously formed.

<Anode>

When the organic EL element is an organic EL element having a configuration in which light emitted from the light-emitting layer is output through the anode, an electrode having light transparency is used for the anode. As the electrode having light transparency, a thin film of a metal oxide, a metal sulfide, and a metal having high electric conductivity can be used and a thin film having high light transmittance is suitably used. Thin films made from, for example, indium oxide, zinc oxide, tin oxide, ITO, indium zinc oxide (IZO), gold, platinum, silver, and copper are used. Among them, the thin films made from ITO, IZO, or tin oxide are suitably used. Examples of the method for forming the anode may include a vacuum deposition method, a sputtering method, an ion plating method, and a plating method. As the anode, organic transparent conductive films such as polyaniline or a derivative thereof and polythiophene or a derivative thereof may be used.

As the anode, a material reflecting light may be used. As the material, a metal, a metal oxide, and a metal sulfide having a work function equal to 3.0 eV or more are preferable.

The thickness of the anode is appropriately determined in consideration of light transparency and electric conductivity. The thickness of the anode is, for example, 10 nm to 10 μm, preferably 20 nm to 1 μm, and further preferably 50 nm to 500 nm.

<Hole Injection Layer>

Examples of a hole injection material constituting the hole injection layer may include oxides such as vanadium oxide, molybdenum oxide, ruthenium oxide, and aluminum oxide, a phenylamine compound, a starburst amine compound, a phthalocyanine compound, amorphous carbon, polyaniline, polythiophene derivatives such as polyethylene dioxythiophene (PEDOT).

Examples of methods for forming the hole injection layer may include the application method, which is previously described, using an ink containing the hole injection material. The hole injection layer may also be formed by a given known method other than the application method.

The thickness of the hole injection layer has different optimum values depending on materials used and is appropriately determined in consideration of required characteristics and easiness of film formation. The thickness of the hole injection layer is, for example, 1 nm to 1 μm, preferably 2 nm to 500 nm, and further preferably 5 nm to 200 nm.

<Hole Transport Layer>

A method for forming the hole transport layer is not particularly limited. Examples of the method for forming the hole transport layer may include a method for forming the hole transport layer using a mixed solution containing a macromolecular binder and a hole transport material when a low molecular hole transport material is used and a method for forming the hole transport layer by the application method using an ink containing a hole transport material when a macromolecular hole transport material is used.

The following describes an example in which the above-described "steps of forming a coating film by applying a coating liquid that contains a material having a crosslinking group, and forming the organic thin film by repeating irradiation of electromagnetic waves to the coating film to cross-link with the crosslinking group" is applied to the step of forming the hole transport layer by the application method using the ink containing the hole transport material.

The hole transport layer that the organic EL element of the present invention has comprises the hole transport material. The hole transport material is not particularly limited as long as the material is an organic compound having a hole transport function. Specific examples of the organic compound having the hole transport function may include polyvinyl carbazole or a derivative thereof, polysilane or a derivative thereof, a polysiloxane derivative having aromatic amine residues in the side chains or the main chain, a pyrazoline derivative, an arylamine derivative, a stilbene derivative, a triphenyldiamine derivative, polyaniline or a derivative thereof, polythiophene or a derivative thereof, polypyrrole or a derivative thereof, polyarylamine or a derivative thereof, poly(p-phenylenevinylene) or a derivative thereof, a polyfluorene derivative, a macromolecular compound having aromatic amine residues, and poly(2,5-thienylenevinylene) or a derivative thereof.

The organic compound having the hole transport function is preferably a macromolecular compound, for example, a polymer. This is because film forming properties can be improved and light-emitting properties of the organic EL element can be uniform when the organic compound having the hole transport function is the macromolecular compound. The polystyrene-equivalent number average molecular weight of the organic compound having the hole transport function is, for example, equal to 10000 or more, preferably $3.0 \times 10^4$ to $5.0 \times 10^5$, and more preferably $6.0 \times 10^4$ to $1.2 \times 10^5$. The polystyrene-equivalent weight average molecular weight of the organic compound having the hole transport function is equal to $1.0 \times 10^4$ or more, preferably $5.0 \times 10^4$ to $1.0 \times 10^6$, and more preferably $1.0 \times 10^5$ to $6.0 \times 10^5$.

Specific examples of the hole transport material may include the hole transport materials disclosed in Japanese Patent Application Laid-open No. S63-70257, Japanese Patent Application Laid-open No. S63-175860, Japanese Patent Application Laid-open No. H2-135359, Japanese Patent Application Laid-open No. H2-135361, Japanese Patent Application Laid-open No. H2-209988, Japanese Patent Application Laid-open No. H3-37992, and Japanese Patent Application Laid-open No. H3-152184.

Among them, preferable examples of the organic compound having the hole transport function may include macromolecular hole transport materials such as polyvinyl carbazole or a derivative thereof, polysilane or a derivative thereof, a polysiloxane derivative having aromatic amine residues in the side chains or the main chain, polyaniline or a derivative thereof, polythiophene or a derivative thereof, a polyfluorene derivative, a macromolecular compound having aromatic amine residues, poly(p-phenylenevinylene) or a derivative thereof, and poly(2,5-thienylenevinylene) or a derivative thereof. More preferable examples of the macromolecular hole transport material may include polyvinyl carbazole or the derivative thereof, polysilane or the derivative thereof, the polysiloxane derivative having aromatic amine residues in the side chains or the main chain, the polyfluorene derivative, and the macromolecular compound having aromatic amine residues. When the organic compound having the hole transport function is a low molecular compound, the organic compound is preferably dispersed in a macromolecular binder.

Polyvinyl carbazole or the derivative thereof that is the organic compound having the hole transport function can be obtained by, for example, cation-polymerizing or radical-polymerizing a vinyl monomer.

Examples of polysilane or the derivative thereof that is the organic compound having the hole transport function may include the compounds described in Chem. Rev, vol. 89, 1359 (1989) and British Patent No. 2,300,196 publication specification. As the synthesis method, the methods described in these documents can be used and particularly the Kipping method is suitably used.

As polysiloxane or the derivative thereof, a compound having the structure of the low molecular hole transport material in the side chains or in the main chain is suitably used because the siloxane skeleton structure has almost no hole transport properties. In particular, examples of polysiloxane or the derivative thereof may include a compound containing aromatic amine residues having hole transport properties in the side chains or the main chain.

As the organic compound having hole transport properties, a polymer having a fluorenediyl group represented by Formula (1) is preferable. This is because hole injection efficiency is improved and current density at the time of drive becomes large when the organic compound having hole transport properties contacts an organic compound having a condensed ring or a plurality of aromatic rings to form the hole transport layer of the organic EL element.

[Chemical Formula 1]

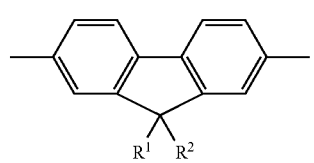

(1)

In Formula (1), $R^1$ and $R^2$ may be the same as or different from each other and each independently represent a hydrogen atom, an alkyl group, an alkoxy group, an aryl group, or a monovalent heterocyclic group. Examples of the alkyl group may include an alkyl group having the number of carbon atoms of 1 to 10. Examples of the alkoxy group may include an alkoxy group having the number of carbon atoms of 1 to 10. Examples of the aryl group may include a phenyl group and a naphthyl group. Examples of the monovalent heterocyclic group may include a pyridyl group. The aryl group and the monovalent heterocyclic group optionally have a substituent and examples of the substituent may include an alkyl group having the number of carbon atoms of 1 to 10 and an alkoxy group having the number of carbon atoms of 1 to 10 because these groups improve solubility of the macromolecular compound.

The aryl group and the monovalent heterocyclic group also optionally have a crosslinking group as the substituent. Examples of the crosslinking group may include a vinyl group, an ethynyl group, a butenyl group, a group having an acrylic structure, a group having an acrylate structure, a group having an acrylamide structure, a group having a methacrylic structure, a group having a methacrylate structure, a group having a methacrylamide structure, a group having a vinyl ether structure, a vinyl amino group, a group having a silanol structure, and a group having a small-membered ring (for example, cyclopropane, cyclobutane, epoxide, oxetane, diketene, and episulfide and the like).

Specific examples of the preferable fluorenediyl groups are illustrated below.

[Chemical Formula 2]

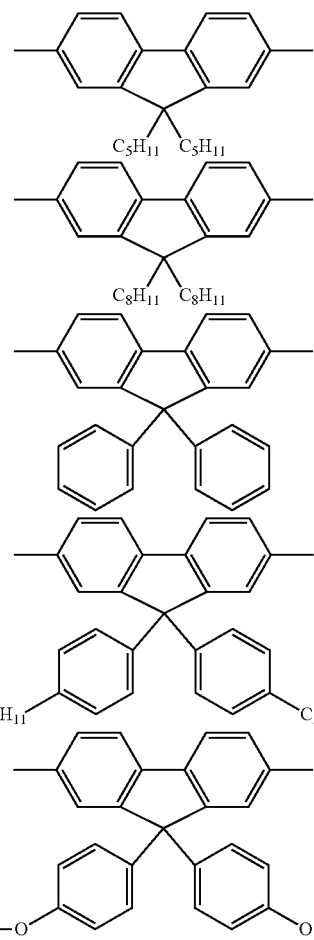

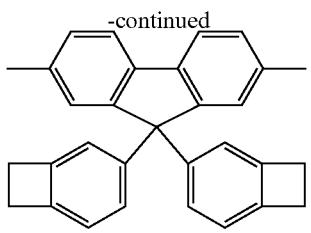

The organic compound having the particularly preferable hole transport function is a polymer comprising a structure having the fluorenediyl group and an aromatic tertiary amine compound as the repeating unit and is, for example, a polyarylamine polymer.

Examples of the repeating unit comprising the structure of the aromatic tertiary amine compound may include the repeating unit represented by Formula (2).

[Chemical Formula 3]

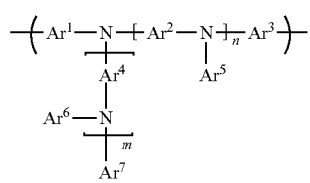

(2)

In Formula (2), $Ar^1$, $Ar^2$, $Ar^3$, and $Ar^4$ each independently represent an arylene group or a divalent heterocyclic group. $Ar^5$, $Ar^6$, and $Ar^7$ each independently represent an aryl group or a monovalent heterocyclic group. Alternatively, $Ar^6$ and $Ar^7$ may form a ring together with nitrogen atoms to which $Ar^6$ and $Ar^7$ are bonded. m and n each independently represent 0 or 1.

Examples of the arylene group may include a phenylene group. Examples of the divalent heterocyclic group may include a pyridinediyl group. These groups optionally have a substituent.

Examples of the aryl group may include a phenyl group and a naphthyl group. Examples of the monovalent heterocyclic group may include a pyridyl group. These groups optionally have a substituent.

Examples of the monovalent heterocyclic group may include a thienyl group, a furyl group, and a pyridyl group.

The substituent that the arylene group, the aryl group, the divalent heterocyclic group, and the monovalent heterocyclic group have is preferably an alkyl group, an alkoxy group, an aryl group and more preferably the alkyl group because these groups improve solubility of the macromolecular compound. Examples of the alkyl group may include an alkyl group having the number of carbon atoms of 1 to 10. Examples of the alkoxy group may include an alkoxy group having the number of carbon atoms of 1 to 10. Examples of the aryl group may include a phenyl group and a naphthyl group.

The substituent also optionally have a crosslinking group. Examples of the crosslinking group may include a vinyl group, an ethynyl group, a butenyl group, a group having an acrylic structure, a group having an acrylate structure, a group having an acrylamide structure, a group having a methacrylic structure, a group having a methacrylate structure, a group having a methacrylamide structure, a group having a vinyl ether structure, a vinyl amino group, a group having a silanol structure, and a group having a small-membered ring (for example, cyclopropane, cyclobutane, epoxide, oxetane, diketene, and episulfide and the like).

$Ar^1$, $Ar^2$, $Ar^3$, and $Ar^4$ are preferably arylene groups and more preferably phenylene groups. $Ar^5$, $Ar^6$, and $Ar^7$ are preferably aryl groups and more preferably phenyl groups.

The carbon atom in $Ar^1$ and the carbon atom in $Ar^3$ may be directly bonded or may be bonded through a divalent group such as a group represented by —O— and a group represented by —S—.

m and n are preferably 0 for easy synthesizing of the monomer.

Specific examples of the repeating unit represented by Formula (2) may include the repeating unit represented by the following formulae.

[Chemical Formula 4]

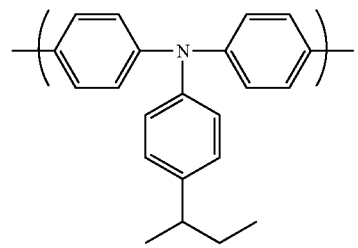

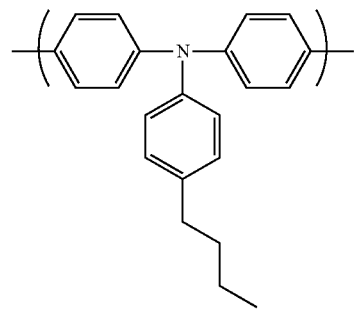

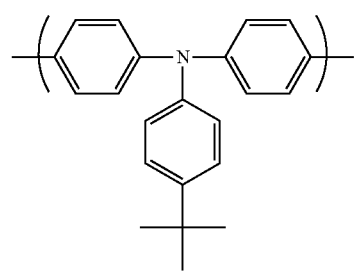

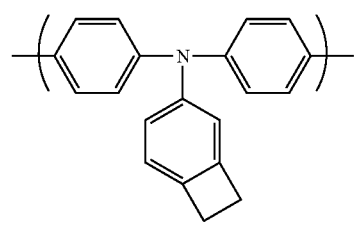

-continued

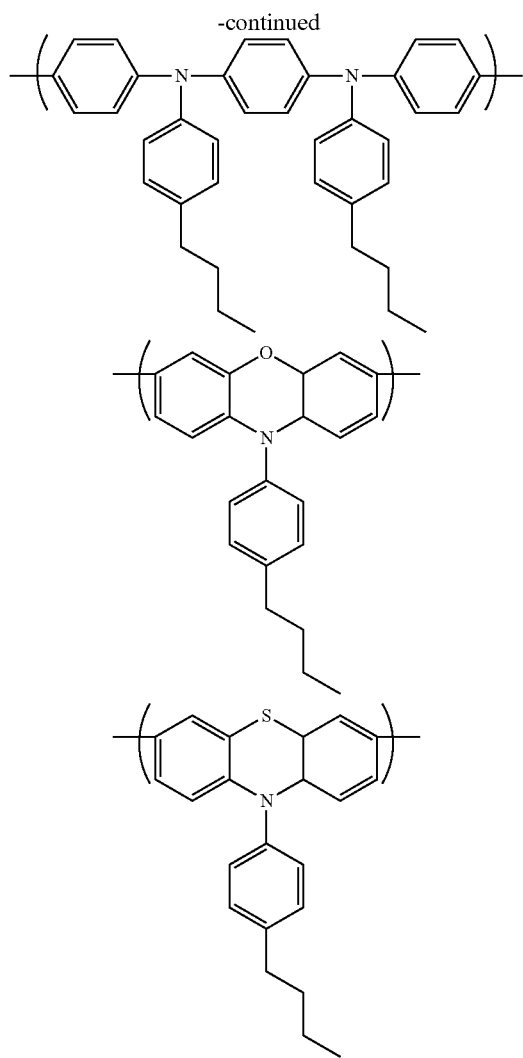

When the organic compound having the hole transport function does not have the crosslinking group, a crosslinking agent is further added as a material having the crosslinking group. Examples of the crosslinking agent may include a compound having a polymerizable substituent selected from the group consisting of a vinyl group, an acetyl group, a butenyl group, an acryl group, an acrylamide group, a methacrylic group, a methacrylamide group, a vinyl ether group, a vinylamino group, a silanol group, a cyclopropyl group, a cyclobutyl group, an epoxy group, an oxetane group, a diketene group, an episulfide group, a lactone group, and a lactam group. Examples of the crosslinking agent may preferably include a multifunctional acrylate such as dipentaerythritol hexaacrylate (DPHA) and tris pentaerythritol octaacrylate (TPEA).

As described above, by the use of the material having the crosslinking group or the crosslinking agent, even when another functional layer (an upper layer) is further formed onto the lower layer (the hole transport layer) by the application method, the dissolution of the lower layer caused by the solvent and the like for forming the upper layer can be effectively reduced.

A method for forming the hole transport layer is not limited. Examples of the method may include a method for forming a film using a mixed solution of a macromolecular binder and the organic compound when the organic compound having the hole transport function is a low molecular compound. Examples of the method may include a method for forming a film using a solution when the organic compound having the hole transport function is a macromolecular compound.

A solvent used for forming the film using a solution is not particularly limited as long as the solvent dissolves the hole transport material. Examples of the solvent may include chloride solvents such as chloroform, methylene chloride, and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate, and ethyl cellosolve acetate.

Examples of the method for forming the film using the solution may include the application method, which is previously described.

As the macromolecular binder used for the mixed solution, a binder that does not excessively inhibit charge transport is preferable. In addition, a binder having low absorption to visible light is suitably used. Examples of the macromolecular binder may include polycarbonate, polyacrylate, polymethyl acrylate, polymethyl methacrylate, polystyrene, polyvinyl chloride, and polysiloxane.

The thickness of the hole transport layer has different optimum values depending on materials used and is selected so that drive voltage and light-emitting efficiency have appropriate values. The hole transport layer requires at least a thickness in such an extent that pinholes are not generated. If the thickness is extremely large, the drive voltage of the organic EL element may be high. The thickness of the hole transport layer is for example 1 nm to 1 µm, preferably 2 nm to 500 nm, and further preferably 5 nm to 200 nm.

<Light-Emitting Layer>

The light-emitting layer generally comprises an organic substance mainly emitting fluorescence and/or phosphorescence or comprises the organic substance and a dopant assisting emission. The dopant is added, for example, for improving light-emitting efficiency or changing the wavelength of the emitted light. Here, the organic substance is preferably a macromolecular compound because the compound improves solubility. The light-emitting layer preferably comprises a macromolecular compound having a polystyrene-equivalent number average molecular weight of $10^3$ to $10^8$. Examples of the light emitting material constituting the light-emitting layer may include the following dye material, metal complex material, macromolecular material, and dopant material.

(Dye Material)

Examples of the dye material may include a cyclopentamine derivative, a tetraphenylbutadiene derivative, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a pyrazoline dimer, a quinacridone derivative, and a coumarin derivative.

(Metal Complex Material)

Examples of the metal complex material may include a metal complex having center metal comprising rare earth metals such as Tb, Eu and Dy, or Al, Zn, Be, Pt, and Ir and having ligands such as oxadiazole, thiadiazole, phenylpyridine, phenylbenzimidazole, and a quinoline structure. Examples of the metal complex may include metal complexes having light emission from the triplet excited state such as an iridium complex and a platinum complex, an aluminum quinolinol complex, a benzoquinolinol beryllium complex, a benzoxazolyl zinc complex, a benzothiazole zinc complex, an azomethyl zinc complex, a porphyrin zinc complex, and a phenanthroline europium complex.

(Macromolecular Material)

Examples of the macromolecular material may include a polyparaphenylenevinylene derivative, a polythiophene derivative, a polyparaphenylene derivative, a polysilane derivative, a polyacetylene derivative, a polyfluorene derivative, a polyvinyl carbazole derivative, and materials in which the dye material and the metal complex material are polymerized.

(Dopant Material)

Examples of the dopant material may include a perylene derivative, a coumarin derivative, a rubrene derivative, a quinacridone derivative, a squalium derivative, a porphyrin derivative, a styryl dye, a tetracene derivative, a pyrazolone derivative, decacyclene, and phenoxazone.

The thickness of the light-emitting layer is generally 2 nm to 200 nm. The light-emitting layer can be formed by the application method using an ink containing the light emitting material as described above.

<Electron Transport Layer>

As an electron transport material constituting the electron transport layer, a known material can be used. Examples of the electron transport material constituting the electron transport layer may include an oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, or a metal complex of 8-hydroxyquinoline or a derivative thereof, polyquinoline or a derivative thereof, polyquinoxaline or a derivative thereof, and polyfluorene or a derivative thereof.

Among them, preferable as the electron transport material are the oxadiazole derivative, benzoquinone or the derivative thereof, anthraquinone or the derivative thereof, or the metal complex of 8-hydroxyquinoline or the derivative thereof, polyquinoline or the derivative thereof, polyquinoxaline or the derivative thereof, and polyfluorene or the derivative thereof. In particular, 2-(4-biphenylyl)-5-(4-tert-butylphenyl)-1,3,4-oxadiazole, benzoquinone, anthraquinone, tris(8-quinolinol)aluminum, and polyquinoline are further preferable.

A method for forming the electron transport layer is not particularly limited. Examples of the method for forming the low molecular electron transport layer may include a vacuum deposition method using powder and a method for forming a film from a solution or a melted state when a low molecular electron transport material is used, and may include a method for forming a film from a solution or a melted state when a macromolecular electron transport material is used. When the electron transport layer is formed from the solution or the melted state, a macromolecular binder may be used together.

The thickness of the electron transport layer has different optimum values depending on materials used and is appropriately determined in consideration of required characteristics and easiness of film formation. The thickness of the electron transport layer is for example 1 nm to 1 µm, preferably 2 nm to 500 nm, and further preferably 5 nm to 200 nm.

<Electron Injection Layer>

As a material constituting the electron injection layer, an optimum material is appropriately selected depending on types of the light-emitting layers. Examples of the material constituting the electron injection layer may include alkali metals, alkaline earth metals, alloys comprising one or more alkali metals and alkaline earth metals, oxides, halides, and carbonates of the alkali metals and the alkaline earth metals, or mixtures of these substances. Examples of the alkali metals, the alkali metal oxides, the alkali metal halides, and the alkali metal carbonates may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metals, the alkaline earth metal oxides, the alkaline earth metal halides, and the alkaline earth metal carbonates may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be constituted by a stacked body formed by stacking two or more layers. Examples of such a stacked body may include a stacked body of a LiF layer and a Ca layer. The electron injection layer can be formed by certain known methods such as a vapor deposition method, a sputtering method, and a printing method. The thickness of the electron injection layer is preferably about 1 nm to 1 µm.

<Cathode>

As a material for the cathode, a material having a small work function, being easy to inject electrons to the light-emitting layer, and having high electric conductivity is preferable. In the organic EL element taking out light from the anode side, reflection of emitted light from the light-emitting layer to the anode side at the cathode is preferable for improving light-emitting efficiency. For this purpose, a material having high visible light reflectance is preferable as the material for the cathode. As the material for the cathode, for example, alkali metals, alkaline earth metals, transition metals, and the group 13 metals in the periodic table can be used. Examples of the usable material for the cathode may include metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys made of two or more of these metals, alloys made of one or more of these metals and one or more of gold, silver, platinum, copper, manganese, titanium, cobalt, nickel, tungsten, and tin, or graphite or intercalation graphite compounds. Examples of the alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. As the cathode, a transparent conductive electrode made from a conductive metal oxide and a conductive organic substance can be used. Specifically, examples of the conductive metal oxide may include indium oxide, zinc oxide, tin oxide, ITO, and IZO. Examples of the conductive organic substance may include polyaniline or a derivative thereof and polythiophene or a derivative thereof. The cathode may be constituted by a stacked body in which two or more layers are stacked. The electron injection layer may also be used as the cathode.

The thickness of the cathode is appropriately determined in consideration of electric conductivity and durability. The thickness of the cathode is, for example, 10 nm to 10 µm, preferably 20 nm to 1 μm, and further preferably 50 nm to 500 nm. Examples of the method for forming the cathode may include a vacuum deposition method, a sputtering method, and a laminating method in which a metal thin film is bonded by thermocompression.

The organic EL element of the present embodiment as described above can be suitably used for a curved surface shape or flat surface shape illumination device, a sheet light source used for a light source of a scanner, and a display device.

<Organic Photovoltaic Device>

The outline of the organic photovoltaic device according to the present embodiment will be described.

The organic photovoltaic device can be classified into two types, that is, a bulk heterojunction type organic photovoltaic device and a heterojunction type organic photovoltaic device depending on the configuration of an active layer (may be referred to as an organic semiconductor layer). The method for manufacturing the electronic device of the present invention can be applied to both types of the organic photovoltaic devices.

As a basic configuration, the organic photovoltaic device comprises a pair of electrodes one of which is transparent or translucent, and a stacked structure comprising one active layer made of an organic thin film when the organic photovoltaic device is a bulk heterojunction type organic photovoltaic device or two active layers made of organic thin film layers when the organic photovoltaic device is a heterojunction type organic photovoltaic device, located between the pair of electrodes.

Hereinafter, a substrate, electrodes, an active layer, and other components formed if needed, constituting the organic photovoltaic device, will be described.

<Substrate>

The organic photovoltaic device generally has a configuration in which each of the layers described above is stacked on the substrate comprising a rigid substrate and a flexible substrate. The substrate may be a substrate on which electrodes can be formed and that does not chemically changed during the formation of an organic thin film, and the same substrate as the substrate applicable to the organic EL element can be used.

<Electrodes>

At least one of the pair of electrodes (the anode and the cathode) is constituted by a transparent or translucent electrode material. An electrode opposite to an opaque substrate (that is, an electrode further from the opaque substrate) is transparent or translucent. Examples of the transparent or translucent electrode material may include a conductive metal oxide film and a translucent thin metal film. Specific examples of the transparent or translucent electrode material may include a film prepared by using a conductive material such as indium oxide, zinc oxide, tin oxide, ITO, IZO, and NESA and a film formed by using gold, platinum, silver, and copper. Among them, the film made of ITO, IZO, or tin oxide is preferable.

When one of the pair of electrodes is transparent or translucent, the other electrode may be an opaque electrode. As the material for the opaque electrode, metals and conductive macromolecules can be used. Examples of the material for the opaque electrode may include metals such as lithium, sodium, potassium, rubidium, cesium, magnesium, calcium, strontium, barium, aluminum, scandium, vanadium, zinc, yttrium, indium, cerium, samarium, europium, terbium, and ytterbium, alloys made of two or more of these metals, alloys made of one or more of these metals and one or more of gold, silver, platinum, copper, manganese, titanium, cobalt, nickel, tungsten, and tin, graphite, intercalation graphite compound, polyaniline or a derivative thereof, and polythiophene and a derivative thereof. Examples of the alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

Examples of the method for forming these electrodes may include a vacuum deposition method, a sputtering method, an ion plating method, and a plating method. As the electrode material, organic transparent conductive films such as polyaniline or derivatives thereof and polythiophene or derivatives thereof may be used. The transparent or translucent electrode may be the anode or may be the cathode.

<Active Layer>

In the active layer included in the organic photovoltaic device, the electron donating compound and the electron accepting compound are contained in the case of the bulk heterojunction type organic photovoltaic device, and a layer containing the electron donating compound and a layer containing the electron accepting compound are bonded in the case of the heterojunction type organic photovoltaic device.

The electron donating compound is not particularly limited. Examples of the electron donating compound may include a pyrazoline derivative, an arylamine derivative, a stilbene derivative, a triphenyldiamine derivative, oligothiophene and a derivative thereof, polyvinylcarbazole and a derivative thereof, polysilane and a derivative thereof, a polysiloxane derivative having aromatic amine in the side chains or the main chain, polyaniline and a derivative thereof, a polythiophene and a derivative thereof, a macromolecular compound having a thiophene as a partial skeleton, polypyrrole and a derivative thereof, polyphenylenevinylene and a derivative thereof, and polythienylenevinylene and a derivative thereof.

Preferable examples of the electron accepting compound may include a compound containing a benzothiadiazole structure, a macromolecular compound containing a benzothiadiazole structure as repeating units, a compound containing a quinoxaline structure, a macromolecular compound containing a quinoxaline structure as repeating units, titanium oxide, carbon nanotubes, fullerenes, and a fullerene derivative.

In order to exert various functions, the active layer may contain components in addition to the above-described components. Examples of the components in addition to the above-described components may include an ultraviolet absorber, an antioxidant, a sensitizer for sensitizing a function of generating electric charges by absorbed light, and a light stabilizer for increasing stability to ultraviolet rays.

In order to improve mechanical properties, the active layer may include a macromolecular compound as a macromolecular binder in addition to the electron donating compound and the electron accepting compound. As the macromolecular binder, a binder that does not excessively inhibit electron transport properties or hole transport properties and a binder that absorbs visible light in a small amount are preferably used.

Examples of the macromolecular binder may include poly(N-vinylcarbazole), polyaniline and a derivative thereof, polythiophene and a derivative thereof, poly(p-phenylenevinylene) and a derivative thereof, poly(2,5-thienylenevinylene) and a derivative thereof, polycarbonate, polyacrylate, polymethyl acrylate, polymethyl methacrylate, polystyrene, polyvinyl chloride, and polysiloxane.

The active layer having the above-described configuration can be formed by, for example, forming a film using a solution containing the electron donating compound, the electron accepting compound, and other components that are added if needed in the case of the bulk heterojunction type organic photovoltaic device. For example, the active layer can be formed by applying the solution onto the anode or the cathode.

The solvent used for forming the film using the solution may be a solvent that dissolves the above-described electron donating compound and electron accepting compound. The solvent may be used by mixing a plurality of solvents. Examples of the solvents may include unsaturated hydrocarbon solvents such as toluene, xylene, mesitylene, tetralin, decalin, bicyclohexyl, butylbenzene, sec-butylbenzene, and tert-butylbenzene; halogenated saturated hydrocarbon solvents such as carbon tetrachloride, chloroform, dichloromethane, dichloroethane, dichloropropane, chlorobutane, bromobutane, chloropentane, bromopentane, chlorohexane, bromohexane, chlorocyclohexane, and bromocyclohexane; halogenated unsaturated hydrocarbon solvents such as chlorobenzene, dichlorobenzene, and trichlorobenzene; and ether solvents such as tetrahydrofuran and tetrahydropyran. For example, the dissolved amount of the materials constituting the active layer in the solvent can be equal to 0.1% by weight or more.

The application method that is previously described can be used for the film formation of the active layer.

In the present embodiment, certain layers comprising the active layer can be formed by forming a coating film by applying a coating liquid that contains a material having a crosslinking group, and forming the organic thin film by repeating irradiation of electromagnetic waves to the coating film to cross-link with the crosslinking group. In this step, the material having the crosslinking group as the substituent and the crosslinking agent can be used as the material having the crosslinking group.

<Other Layers>

In addition to the substrate, the electrodes (the anode and the cathode), and the active layer, the organic photovoltaic device may include additional interlayers (a buffer layer, a charge transport layer, and the like) other than the active layer may be added in order to improve photovoltaic efficiency. Such interlayers can be provided, for example, between the anode and the active layer or between the cathode and the active layer.

Examples of the material used for the interlayers may include halides or oxides of alkali metals or alkaline earth metals such as lithium fluoride. As the material for the interlayers, fine particles of inorganic semiconductors such as titanium oxide and a mixture (PEDOT:PSS) of PEDOT (poly(3,4-ethylenedioxythiophene)) and PSS (poly(4-styrenesulfonate)) may be used.

<Organic Thin Film Transistor>

The outline of the organic thin film transistor according to the present embodiment will be described.

Examples of the organic thin film transistor may include a transistor having a configuration comprising a source electrode and a drain electrode, an active layer that acts as a current path between these electrodes and comprises the macromolecular compound of the present invention, and a gate electrode that controls a current amount passing through the current path. Examples of the organic thin film transistor having such a structure may include a field-effect organic thin film transistor and a static induction organic thin film transistor.

The field-effect organic thin film transistor generally has the source electrode and the drain electrode, the active layer comprising the macromolecular compound that acts as a current path between the electrodes, the gate electrode that controls a current amount passing through the current path, and an insulating layer located between the active layer and the gate electrode.

The static induction organic thin film transistor generally has the source electrode and the drain electrode, the active layer comprising the macromolecular compound that acts as a current path between the electrodes, and the gate electrode that controls a current amount passing through the current path. The gate electrode is provided in the active layer.

The gate electrode may have a structure in which the current path through which current flows from the source electrode to the drain electrode can be formed and the current amount flowing through the current path can be controlled by the voltage applied to the gate electrode. For example, the embodiment of the gate electrode comprises a comb-shaped electrode.

The field-effect organic thin film transistor can be manufactured by the known method, for example, the method described in Japanese Patent Application Laid-open No. H5-110069. The static induction organic thin film transistor can be manufactured by the known method described in Japanese Patent Application Laid-open No. 2004-006476 and other methods.

<Substrate>

The organic thin film transistor is generally formed on a substrate comprising a rigid substrate and a flexible substrate. The material for the substrate is not particularly limited as long as the material does not inhibit the properties of the organic thin film transistor. As the material for the substrate, the same substrate as the substrate that can be used for the organic EL element.

<Insulating Layer>

The material for the insulating layer may be a material having high electrical insulating properties. Examples of the usable material for the insulating layer may include $SiO_x$, $SiN_x$, $Ta_2O_5$, polyimide, polyvinyl alcohol, polyvinyl phenol, organic glass, and a photoresist. The material having a high dielectric constant is preferably used because operation voltage can be reduced.

<Gate Electrode>

Examples of the usable material for the gate electrode may include metals such as gold, platinum, silver, copper, chromium, palladium, aluminum, indium, molybdenum, low-resistance polysilicon, and low-resistance amorphous silicon; tin oxide, indium oxide, and ITO. These materials can be used singly or in combination of two or more of them. As the gate electrode, a silicon substrate in which impurities are doped in high concentration may be used.

<Source Electrode and Drain Electrode>

The source electrode and the drain electrode are preferably constituted with low resistance materials and particularly preferably constituted with gold, platinum, silver, copper, chromium, palladium, aluminum, indium, and molybdenum. These materials can be used singly or in combination of two or more of them.

<Other Layers>

In the organic thin film transistor, a layer constituted by other compounds may be located between the source electrode and drain electrode, and the active layer. Examples of such a layer may include a layer made from a low molecular compound having electron transporting properties, a low molecular compound having hole transporting properties, alkali metals, alkaline earth metals, rare earth metals, complexes of these metals with organic compounds, halogens such as iodine, bromine, chlorine, and iodine chloride, sulfur oxide compounds such as sulfuric acid, sulfuric anhydride, sulfur dioxide, and sulfates, nitrogen oxide compounds such as nitric acid, nitrogen dioxide, and nitrates, halide compounds such as perchloric acid and hypochlorous acid, alkylthiol compounds, aromatic thiols, and aromatic thiol compounds such as fluorinated alkyl aromatic thiols.

<Protection Film>

In order to protect the organic thin film transistor, a protection film is preferably formed on the organic thin film transistor. By the protection film, the organic thin film transistor is shielded from the atmosphere and thus deterioration in electric properties of the organic thin film transistor can be reduced. When another electronic device is formed over the organic thin film transistor, the effect on the organic thin film transistor in this formation step can be reduced by the protection film. Examples of a method for forming the protection film may include a method for covering the organic thin film transistor with a film made from materials such as a UV curing resin, a thermosetting resin, or $SiON_x$ as a material.

The certain layers comprising the semiconductor layer and the insulating layer can be formed by forming a coating film by applying a coating liquid that contains a material having a crosslinking group, and forming the organic thin film by repeating irradiation of electromagnetic waves to the coating film to cross-link with the crosslinking group. As the material having the crosslinking group used for forming the certain layers, the material having the crosslinking group as the substituent and the crosslinking agent can be used.

EXAMPLES

Hereinafter, the present invention will be more specifically described with reference to Examples and Comparative Example. However, the present invention is not limited to those Examples and Comparative Example. In the following Examples and Comparative Example, electromagnetic-wave irradiation conditions and heating conditions are determined so that a residual film ratio is about 80%.

<Filter>

First, filters used in Examples 1 to 3 will be described with reference to FIGS. 1 and 2.

Figure 2:
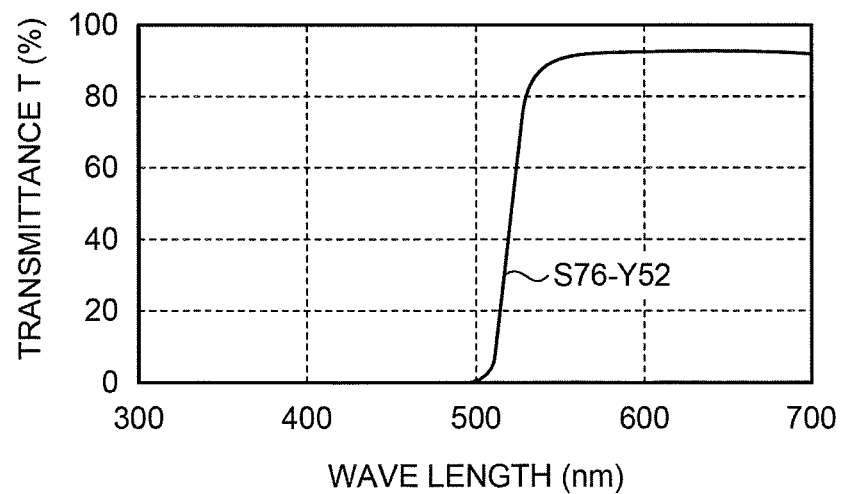
FIG. 2 is a graph (2) illustrating characteristics of a filter used.

FIGS. 1 and 2 are graphs illustrating the properties of the filters. The filters used are what is called sharp cut filters. These filters have a function by which light having shorter wavelength than the prescribed wavelength is absorbed and only light having longer wavelength than the prescribed wavelength is transmitted.

The sharp cut filter is characterized by transmission limit wavelength that is a value corresponding to the midpoint of the inclined width of wavelength, that is, an interval between the value of wavelength in which the transmittance is 72% (high transmission limit wavelength) and the value of wavelength in which the transmittance is 5% (absorption limit wavelength) in a spectral transmission factor. In FIG. 1, the transmission limit wavelength of S76-L37 (trade name) is 370 (nm) and the transmission limit wavelength of S76-L42 is 420 (nm). In FIG. 2, the transmission limit wavelength of S76-Y52 is 520 (nm).

Synthesis Example

Synthesis of Macromolecular Compound 1

Into a reactor purged with an inert gas, 18 g of 2,7-bis(1,3,2-dioxaborolan-2-yl)-9,9-dioctylfluorene (C8BE) represented by Formula (3), 13 g of bis(4-bromophenyl)-4-sec-butylphenylamine (TFBR) represented by Formula (4), 2 g of 3,4-cyclobuteno-N,N-bis(4-bromophenyl)aniline (BCTR) represented by Formula (5), 3 g of methyltrioctylammonium chloride (trade name: Aliquat336, manufactured by Sigma-Aldrich Co. LLC.), and 200 g of toluene were weighted and charged. The reactor was heated at 100° C., and 7.4 mg of palladium acetate (II), 70 mg of tri(o-tolyl)phosphine, and 64 g of approximately 18% by mass of aqueous sodium carbonate solution were added, followed by stirring and heating the mixture for 3 hours or more. Thereafter, 400 mg of phenylboronic acid was added and the mixture was further stirred and heated for 5 hours. The reaction liquid was diluted with 1900 g of toluene and washed two times with 60 g of 3% by mass aqueous acetic acid solution, followed by washing one time with 60 g of ion-exchanged water. Thereafter, 1.5 g of DCC (sodium diethyldithiocarbamate trihydrate) was added to the taken out organic phase and the mixture was stirred for 4 hours. The obtained solution was purified by column chromatography using a mixture of equal amounts of alumina and silica gel as the stationary phase. The resultant toluene solution was dropped into methanol. After stirring, the obtained precipitate was filtered and dried to obtain a macromolecular compound 1 made of repeating units represented by Formula (6). In Formula (6), a number attached to each repeating unit represents the composition ratio of the repeating unit in the macromolecular compound 1.

The obtained macromolecular compound 1 had a polystyrene-equivalent number average molecular weight of $8.9 \times 10^4$ and a polystyrene-equivalent weight average molecular weight of $4.2 \times 10^5$.

[Chemical Formula 5]

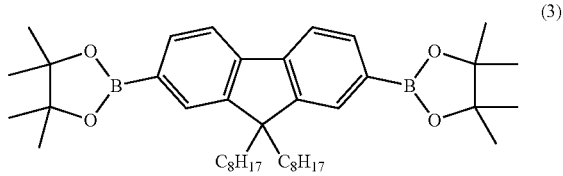

(3)

[Chemical Formula 6]

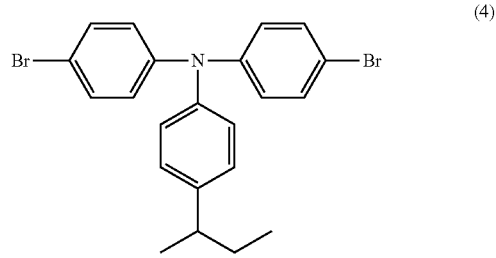

(4)

[Chemical Formula 7]

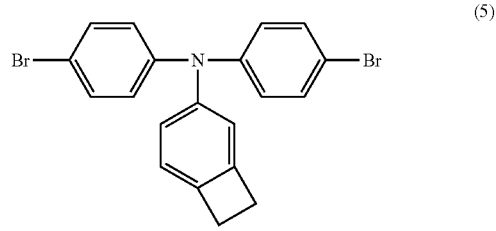

(5)

-continued

[Chemical Formula 8]

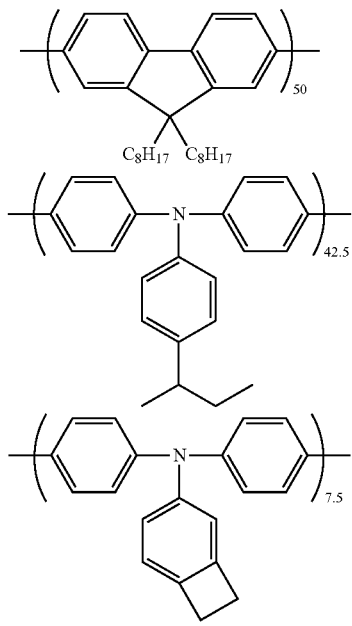

(6)

Example 1

An organic EL element having the following configuration was prepared.

"Glass substrate/ITO layer (thickness 50 nm)/Layer containing PEDOT (thickness 65 nm)/Layer containing macromolecular compound 1 (thickness 20 nm)/Layer containing macromolecular compound 2 (thickness 80 nm)/NaF layer (thickness 4 nm)/Al layer (thickness 100 nm)".

Here, the layer containing PEDOT is corresponding to the hole injection layer, the layer containing the macromolecular compound 1 is corresponding to the hole transport layer, and the layer containing the macromolecular compound 2 is corresponding to the light-emitting layer.

First, a suspension of poly(3,4-ethylenedioxythiophene)/polystyrene sulfonic acid (PEDOT: manufactured by Bayer AG, trade name "BaytronP AI4083") was filtered with a membrane filter having a pore size of 0.2 μm to obtain a filtrate. The filtrate was applied by a spin coating method to a glass substrate on which an ITO film (anode) having a thickness of 50 nm is formed by a sputtering method. Thereafter, the hole injection layer having a thickness of 65 nm was obtained by heat treatment at 200° C. for 20 minutes. The hole injection layer was formed in the air atmosphere.

Subsequently, a xylene solution in which the macromolecular compound 1 obtained in Synthesis Example was dissolved was prepared. The concentration of the macromolecular compound 1 in the xylene solution was determined to be 0.5% by weight. Subsequently, in the air atmosphere, the obtained xylene solution was applied to a glass substrate by the spin coating method to form a coating film for the hole transport layer having a thickness of 20 nm.

Subsequently, in the air atmosphere, the sharp cut filter S76-Y52 manufactured by SURUGA SEIKI CO., LTD. was located over the glass substrate and the coating film was repeatedly irradiated with electromagnetic waves through the filter using RC801 Flash Lamp manufactured by Xenon Corporation. An irradiation time was determined to be 180 seconds. An energy per pulse was determined to be 3.68 J/cm² (here, an area having a size of 7.5 cm square was irradiated with an electromagnetic wave having an energy per pulse of 207 J). The pulse width per pulse was determined to be 168 μs and the frequency was determined to be 10 Hz. By this, a thin film (an organic thin film) that was solidified by crosslinking reaction of the crosslinking group in the macromolecular compound 1 in the coating film was formed to obtain a hole transport layer.

Subsequently, the macromolecular compound 2 being an light emitting material was dissolved in xylene to prepare a xylene solution. The concentration of the macromolecular compound 2 in the xylene solution was determined to be 1.3% by weight. In the air atmosphere, the obtained xylene solution was applied to a glass substrate by the spin coating method to form a coating film for the light-emitting layer having a thickness of 80 nm. In nitrogen gas atmosphere in which both an oxygen concentration and a moisture content were controlled to 10 ppm or less in a volume ratio, the coating film was left to stand at 170° C. for 10 minutes to dry the coating film, and whereby an light-emitting layer was obtained.

Subsequently, under vacuum, sodium fluoride (NaF) was deposited in a thickness of about 4 nm and aluminum (Al) was further deposited in a thickness of about 100 nm so as to stack these layers and whereby an cathode was prepared. After the formation of the cathode, an organic EL element was prepared by sealing with a glass substrate being a sealing substrate.

The current efficiency of the prepared organic EL element was measured, and the maximum current efficiency of 11 cd/A was obtained.

Example 2

In Example 2, as the formation of the layer containing the macromolecular compound 1, an organic EL element was formed in a similar manner to Example 1 except that the sharp cut filter used at the time of irradiation with a flash lamp was changed. Specifically, the sharp cut filter S76-L42 was used in Example 2.

The current efficiency of the prepared organic EL element was measured, and the maximum current efficiency of 11 cd/A was obtained.

Example 3

In Example 3, as the formation of the layer containing the macromolecular compound 1, an organic EL element was formed in a similar manner to Example 1 except that the sharp cut filter used at the time of irradiation with a flash lamp was changed. Specifically, the sharp cut filter S76-L37 was used in Example 3.

The current efficiency of the prepared organic EL element was measured, and the maximum current efficiency of 6 cd/A was obtained.

Example 4

In example 4, as the formation of the layer containing the macromolecular compound 1, an organic EL element was formed in a similar manner to Example 1 except that the sharp cut filter was not used.

The current efficiency of the prepared organic EL element was measured, and the maximum current efficiency of 6 cd/A was obtained.

Comparative Example 5

In Comparative Example, as the formation of the layer containing the macromolecular compound 1, an organic EL element was formed in a similar manner to Example 1 except that a hot plate was used instead of the flash lamp. Specifically, in the air atmosphere, the xylene solution prepared by dissolving the macromolecular compound 1 in xylene was applied to a glass substrate by the spin coating method to form a coating film for the hole transport layer having a thickness of 20 nm. The obtained coating film was left to stand at 180° C. for 60 minutes in the air atmosphere to form a solidified thin layer film and whereby the hole transport layer was obtained.

The current efficiency of the prepared organic EL element was measured, and the maximum current efficiency of 6 cd/A was obtained.

(Measurement of Residual Film Ratio)

The residual film ratio was measured in Examples 1 to 4 and Comparative Example as described below.

The macromolecular compound 1 was dissolved in xylene to prepare a xylene solution 1. The concentration of the macromolecular compound 1 in the xylene solution 1 was determined to be 0.5% by weight. Subsequently, in the air atmosphere, the xylene solution 1 was applied to a glass substrate by the spin coating method to form a coating film of the macromolecular compound 1. The obtained coating film was irradiated with the flash lamp (Examples 1 to 4) or treated with heating using the hot plate (Comparative Example) and then xylene was dropped onto the coating film, followed by applying the drops of xylene to the coating film by the spin coating method. The thickness of the residual coating film was measured using a stylus-type film thickness meter P16 manufactured by Tencor Corporation. The measured value was determined to be a film thickness 1.

The macromolecular compound 1 was dissolved in xylene to prepare a xylene solution 1. The concentration of the macromolecular compound 1 in the xylene solution 1 was determined to be 0.5% by weight. Subsequently, in the air atmosphere, the xylene solution 1 was applied to a glass substrate by the spin coating method to form a coating film of the macromolecular compound 1. The thickness of the obtained coating film was measured using a stylus-type film thickness meter P16 manufactured by Tencor Corporation. The measured value was determined to be a film thickness 2. By using the obtained measurement values of the film thickness 1 and the film thickness 2, the residual film ratio was determined based on a formula: Residual film ratio= (Film thickness 1/Film thickness 2).

The devices used, the conditions, the filters, and the measured values of the residual film ratio (%) and maximum current efficiency (cd/A) in Examples 1 to 4 and Comparative Example are listed in Table 1.

TABLE 1

|  | Device used | Conditions | Filter | Residual film ratio | Maximum current efficiency (cd/A) |
| --- | --- | --- | --- | --- | --- |
| Example 1 | Flash lamp | Irradiation for 180 seconds | S76-Y52 | 81% | 11 |
| Example 2 | Flash lamp | Irradiation for 120 seconds | S76-L42 | 78% | 11 |
| Example 3 | Flash lamp | Irradiation for 60 seconds | S76-L37 | 86% | 6 |
| Example 4 | Flash lamp | Irradiation for 60 seconds | N/A | 94% | 6 |
| Comparative Example | Hot plate | Heating at 180° C. for 60 minutes | — | 83% | 6 |

As is clear from Table 1, according to the method for manufacturing the electronic device and the method for manufacturing the thin film used for the electronic device of the present invention described above, the thin film and the organic EL that achieves at least almost the same degree of the residual film ratio and the current efficiency in an extremely short period of time compared with the heat treatment using a conventional hot plate was able to be achieved. Therefore, the manufacturing method can be particularly suitably applied to the roll-to-roll method.

The better current efficiency was able to be achieved by using a sharp cut filter and irradiation of light having a longer wavelength by particularly not passing the light having the wavelength of the ultraviolet region. This achievement is considered to be because the thin film can be formed while damage to the substrate or the existing electrodes and functional layers is reduced by using the sharp cut filter.

In the following Examples 5 to 9, organic EL elements were formed in a similar manner to Example 1 except that only the step of forming the layer containing the macromolecular compound 1 was different from Example 1. In the description of Examples 5 to 9, only the step of forming the layer containing the macromolecular compound 1 will be described.

Examples 5 to 9

In the air atmosphere, a xylene solution prepared by dissolving the macromolecular compound 1 in xylene was applied to a glass substrate by the spin coating method to form a coating film for the hole transport layer having a thickness of 20 nm. Subsequently, in $N_2$ atmosphere, a cut filter (Type A) for filtering light having a wavelength of equal to or less than 370 nm manufactured by Xenon Corporation was located over the glass substrate and the coating film was repeatedly irradiated with electromagnetic waves through the filter using RC801 Flash Lamp manufactured by Xenon Corporation. By this, a thin film (an organic thin film) that was solidified by the crosslinking reaction of the crosslinking group in the macromolecular compound 1 in the coating film was formed and a hole transport layer was obtained.

In Examples 5 to 9, only electromagnetic-wave irradiation conditions were different from each other. Here, the total irradiation energy of the electromagnetic waves was determined to be the same and its frequency was determined to be 10 Hz. The electromagnetic-wave irradiation conditions in each Example are listed in Table 2. Percentage expressions of the values of the pulse peak energy, the energy/ pulse, the pulse width, and LT70 in each example in Table 2 are percentages when the values of Example 5 are determined to be the standard (100%).

(Measurement of Residual Film Ratio)

In Examples 5 to 9, the residual film ratios were measured in a similar manner to Examples 1 to 4 and Comparative Example. The measured results are listed in Table 2.

(Current Efficiency and Lifetime)

The maximum current efficiencies (Ea_max (cd/A)) and the lifetimes (LT70) of the organic EL elements manufactured in Examples 5 to 9 were measured. LT70 means a time taken for a brightness to reach 70% of the initial brightness when constant current drive is performed with the initial brightness being set to 5000 cd/m$^2$.

TABLE 2

|  | Pulse peak energy (kW/cm$^2$) | Energy/pulse (J/cm$^2$) | Pulse width (μs) | Irradiation time | Residual film ratio | Ea_max (cd/A) | LT70 (hr) |
|---|---|---|---|---|---|---|---|
| Example 5 | 16.0 (100%) | 3.68 (100%) | 230 (100%) | 90 seconds | 100% | 9.6 | 10.3 (100%) |
| Example 6 | 11.0 (69%) | 2.52 (69%) | 230 (100%) | 130 seconds | 100% | 9.6 | 11.3 (110%) |
| Example 7 | 7.0 (44%) | 1.61 (44%) | 230 (100%) | 200 seconds | 100% | 9.6 | 14.4 (140%) |
| Example 8 | 15.9 (100%) | 3.68 (100%) | 184 (80%) | 110 seconds | 100% | 9.6 | 10.3 (100%) |
| Example 9 | 15.9 (100%) | 3.68 (100%) | 160 (70%) | 130 seconds | 100% | 9.6 | 12.4 (120%) |

As is clear from Table 2, longer lifetime was able to be achieved and, at the same time, almost the same degree of the residual film ratio and the current efficiency as those of the conventional heat treatment are achieved by reducing the pulse peak energy or narrowing the pulse width in the formation of the layer containing the macromolecular compound 1 using the flash lamp described above.

Any results of Examples 5 to 9 indicate that energy intensity per pulse can be reduced and thus suggest that thermal effect on the substrate and other layers can be reduced.

Therefore, the manufacturing method of the present invention can be more suitably applied to the roll-to-roll method.

Any Examples achieved the residual film ratios almost equal to or more than the residual film ratio of Comparative Example. Therefore, according to the manufacturing method of the present invention, it has been suggested that dissolution of the lower layer thin film caused by the solvent for forming the upper layer can be effectively reduced even when another functional layer is further formed as an upper layer by the application method.

The invention claimed is:

1. A method for manufacturing an electronic device comprising two or more electrodes and an organic thin film provided between the two or more electrodes, the method comprising the steps of:
    forming a coating film by applying a coating liquid that comprises a material having a crosslinking group, and
    forming the organic thin film by repeating an irradiation of electromagnetic waves to the coating film to cross-link with the crosslinking group,
    wherein the source of the electromagnetic waves is a xenon flash lamp, and
    wherein at the step of forming the organic thin film, the organic thin film is formed by repeating the irradiation the electromagnetic waves through a filter such that a transmittance of electromagnetic waves wavelength of Which is equal to 400 nm or less is equal to 10% or less.

2. The method for manufacturing the electronic device according to claim 1, wherein
    the electronic device is an organic electroluminescent element, an organic photovoltaic device, or an organic thin film transistor.

3. The method for manufacturing the electronic device according to claim 1, wherein
    the step of forming the organic thin film is carried out by preparing a flexible substrate that is wound on an unwind roll, and unwinding the flexible substrate from the unwind roll and winding the flexible substrate up a wind-up roll.

4. The method for manufacturing the electronic device according to claim 1, wherein
    the step of forming the organic thin film is carried out such that the peak energy of a pulse of the electromagnetic waves is equal to 15.0 kW/cm$^2$ or less.

5. The method for manufacturing the electronic device according to claim 1, wherein
    the step of forming the organic thin film is carried out such that the pulse width per pulse of the electromagnetic waves is equal to 160 μs or less.

6. A method for manufacturing a thin film, the method comprising the steps of:
    forming a coating film by applying a coating liquid that comprises a material having a crosslinking group, and
    forming the thin film by repeating an irradiation of electromagnetic waves to the coating film to cross-link with the crosslinking group,
    wherein the source of the electromagnetic waves is a xenon flash lamp, and
    wherein at the step of forming the thin film, the thin film is formed by repeating the irradiation of the electromagnetic waves through a filter such that a transmittance of electromagnetic waves wavelength of which is equal to 400 nm or less is equal to 10% or less.

* * * * *